United States Patent
Savransky et al.

(10) Patent No.: US 8,076,664 B2
(45) Date of Patent: Dec. 13, 2011

(54) PHASE CHANGE MEMORY WITH LAYERED INSULATOR

(75) Inventors: Semyon D. Savransky, Newark, CA (US); David L. Kencke, Beaverton, OR (US); Ilya V. Karpov, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 226 days.

(21) Appl. No.: 12/004,257

(22) Filed: Dec. 20, 2007

(65) Prior Publication Data

US 2009/0159867 A1    Jun. 25, 2009

(51) Int. Cl.
*H01L 29/04* (2006.01)
*H01L 47/00* (2006.01)
*H01L 29/00* (2006.01)
*H01L 29/02* (2006.01)
*H01L 29/06* (2006.01)
*G11C 11/00* (2006.01)

(52) U.S. Cl. ............ 257/3; 257/1; 257/2; 257/4; 257/5; 365/148

(58) Field of Classification Search .................. None
See application file for complete search history.

(56) References Cited

U.S. PATENT DOCUMENTS

| | | | |
|---|---|---|---|
| 6,339,544 B1 | 1/2002 | Chiang | |
| 6,511,862 B2 | 1/2003 | Hudgens | |
| 6,511,867 B2 | 1/2003 | Lowrey | |
| 6,605,827 B2 | 8/2003 | Katayama | |
| 6,770,531 B2 | 8/2004 | Lowrey | |
| 6,774,388 B2 | 8/2004 | Hudgens | |
| 6,791,102 B2 | 9/2004 | Johnson | |
| 6,841,397 B2 | 1/2005 | Lowrey | |
| 6,893,959 B2 * | 5/2005 | Barth | 438/637 |
| 6,917,052 B2 | 7/2005 | Hudgens | |
| 6,919,578 B2 | 7/2005 | Lowrey | |
| 6,927,410 B2 | 8/2005 | Chen | |
| 7,067,406 B2 * | 6/2006 | Liang et al. | 438/584 |
| 7,119,355 B2 | 10/2006 | Wicker | |
| 7,135,696 B2 | 11/2006 | Karpov | |
| 7,196,005 B2 | 3/2007 | Ho | |
| 7,196,351 B2 | 3/2007 | Chiang | |
| 2005/0127350 A1 * | 6/2005 | Furkay et al. | 257/4 |
| 2005/0263829 A1 * | 12/2005 | Song et al. | 257/379 |
| 2006/0169968 A1 | 8/2006 | Happ | |
| 2006/0175597 A1 * | 8/2006 | Happ | 257/2 |
| 2006/0175599 A1 * | 8/2006 | Happ | 257/4 |
| 2006/0249724 A1 * | 11/2006 | Krusin-Elbaum et al. | 257/2 |
| 2007/0023857 A1 * | 2/2007 | Jin et al. | 257/510 |
| 2008/0197333 A1 * | 8/2008 | Lung | 257/2 |
| 2009/0166600 A1 * | 7/2009 | Park et al. | 257/3 |

OTHER PUBLICATIONS

Kitayama et al. in "Thermal Conductivity of beta-Si3N4: I, Effects of Various Microstructural Factors," 1999, J. Am. Ceram. Soc. 82 (11) 3105-3112, p. 3105.*

(Continued)

*Primary Examiner* — N Drew Richards
*Assistant Examiner* — Michael Jung
(74) *Attorney, Agent, or Firm* — Trop, Pruner & Hu, P.C.

(57) ABSTRACT

A phase change memory may be formed with an insulator made up of two different layers having significantly different thermal conductivities. Pores may be formed within the stack of insulating layers and the pores may be filled with heaters, chalcogenide layers, and electrodes in some embodiments. The use of the two different insulator layers enables embodiments where thermal losses may be reduced and an amorphous region may be maintained along the entire length of the phase change material layer.

10 Claims, 3 Drawing Sheets

OTHER PUBLICATIONS

Yamane et al. in "Measurement of thermal conductivity of silicon dioxide thin films using 3w method," 2002, J. Appl. Phys. 91(12), 9772-9776, Fig. 1.*

Lyeo et al. in "Thermal conductivity of phase-change material Ge2Sb2Te5," 2006, Appl. Phys. Lett 89, 151904-1 to 151904-3, p. 151904, col. 2, 2nd paragraph.*

Urbanski in "Material: LPCVD Silicon Nitride (silicon-rich)", 2004 citing Plummer, "Silicon VLSI Technology", p. 789.*

Llic et al. in "Enumeration of DNA Molecules Bound to a Nanomechanical Oscillator", 2005, NanoLetters, vol. 5, No. 5, p. 925-929.*

Tracy et al. in "Properties of Air: A Manual for Use in Biophysical Ecology", 1980, The University of Wisconsin, Third Edition, 1-44.*

Olorunyolemi et al. in "Thermal Conductivity of Zinc Oxide: From Green to Sintered State", 2002, J. Am. Ceram. Soc. 85 (5) 1249-53.*

* cited by examiner

PHASE CHANGE MEMORY WITH LAYERED INSULATOR

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
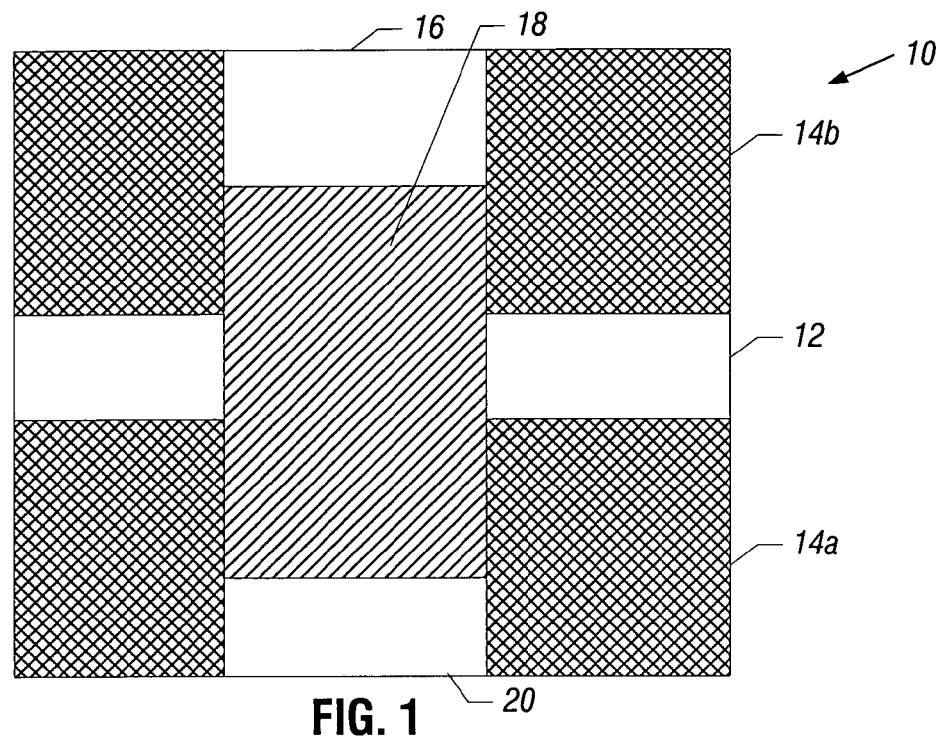
FIG. 1 is a partial, enlarged, cross-sectional view of one embodiment of the present invention.

Referring to FIG. 1, a phase change memory cell 10 may be provided within a phase change memory that includes a large number of such cells arranged in rows and columns, in one embodiment. The cell 10 may include a lower electrode 20 coupled to a potential source and an upper electrode 16, also coupled to that source.

A pore, in one embodiment, may receive both of the electrodes 20 and 16, as well as a phase change material 18 such as, for example, a chalcogenide or pnictide. The pore may be formed in an insulator which includes a first insulator layer 12 and second insulator layers 14a and 14b.

In some embodiments, the first insulator layer 12 may have a thermal conductivity that is much smaller than that of the second insulator layers 14a and 14b. In some embodiments, the insulator layers 14a and 14b may be formed of the same material. For example, the insulator layer 12 may be an air gap or a material such as $WSe_2$ crystal, $ZnS$—$SiO_2$, silica aerogel, or xerogel. The insulator layers 14a and 14b may be silicon dioxide or silicon nitride as two examples.

In some embodiments, the thermal conductivity of the insulator layers 14a and 14b may be twice that of the insulator layer 12. In other embodiments, the insulator layer 12 may have a thermal conductivity that is less than 5% of the thermal conductivity of the phase change material and advantageously less than about one percent of the thermal conductivity of the phase change material 18. In some embodiments, the insulator layers 14a or 14b may have a thermal conductivity that is more than five times the thermal conductivity of the phase change material 18 and ten times the thermal conductivity of the phase change material 18. In some embodiments, the phase change material 18 may be GST, which includes germanium, antimony, and tellurium.

In some cases, it may be advantageous to have the insulator layers 14a and 14b on either side of the insulator layer 12. However, in some embodiments, the layer 14a may be omitted or the layer 14a may be the same material as the layer 12 or may be some other insulator. In some cases, the insulator layer 12 may be much thicker than either insulator layer 14a or 14b.

It may be advantageous to locate the layer 12 centrally along the vertical extent of the phase change material 18 in some embodiments. The insulator layer 12 may enable the confinement of the molten phase change region away from the electrodes 16 and 20. The insulator layers 14a or 14b may be useful for quenching.

In some embodiments, the use of the different insulative layers increases the likelihood of the existence of an amorphous region along the entire phase change material 18. Therefore, in some embodiments, the cell 10 may have increased resistance in the reset state, increased threshold voltage, and increased resistance dynamic range between set and reset states. The amorphous region in the cell may be fixed near the center of the phase change material 18 in some embodiments. The layers 14a and 14b may increase the likelihood that the amorphous region remains centered, despite variations in sidewall angle, interface imperfections, or changes in the phase change material itself. Because the thicknesses of the insulator layers 14a and 14b may be carefully controlled, the size of the amorphous dome may be more regular from bit to bit in the array, providing narrower distributions of characteristics such as threshold voltage and reset resistance that depend on the size of a cell in some cases. In some embodiments, the cell may have reduced distribution of reset state parameters, such as threshold voltage or reset resistance, at the same geometrical variations of cell structure.

In some embodiments, because less heat is lost to surrounding insulators and the phase change material 18 is a good insulator, the cell may be more efficient. Because the amorphous region is away from the electrode 16 or 20 interfaces, less resistive electrodes may be utilized to lower the overall cell resistance.

Figure 2:
FIG. 2 is an enlarged, cross-sectional view corresponding to FIG. 1 at an early stage of manufacture in accordance with one embodiment.

Referring to FIG. 2, one exemplary fabrication sequence for such a cell may begin by forming a stack of layers including a semiconductor substrate or underlayer 15, an electrode stack 20, and insulator layers 12, 14a, and 14b. Then, the layers may be patterned using any of a variety of techniques. For example, damascene lines may be used for the lower electrode contacts. The insulator stack may be formed of well controlled thicknesses. The stack may be patterned by single or double lithography steps and etched to form an array of cylindrical or rectangular holes. Alternatively, at this stage, lines may be patterned that are then isolated from one another by a later patterning step.

Figure 3:
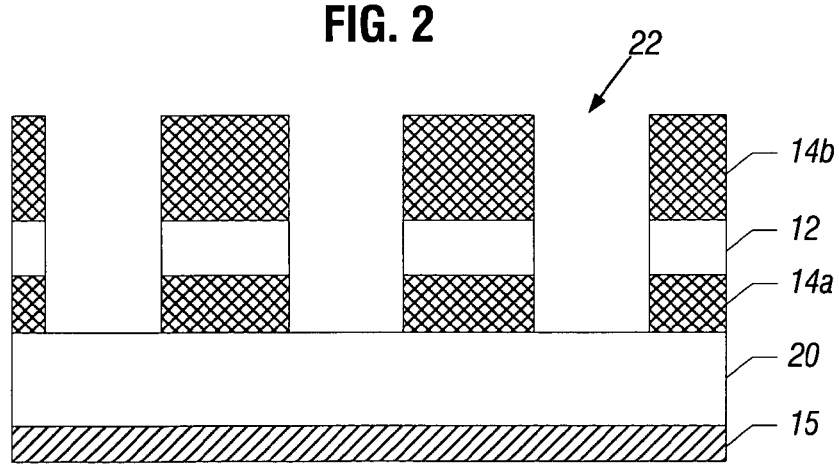
FIG. 3 is an enlarged, cross-sectional view at a subsequent stage of that shown in FIG. 2 in accordance with one embodiment.

Thus, as shown in FIG. 3, the etched openings 22 may be formed in the stack of layers down to the electrode stack 20.

Figure 4:
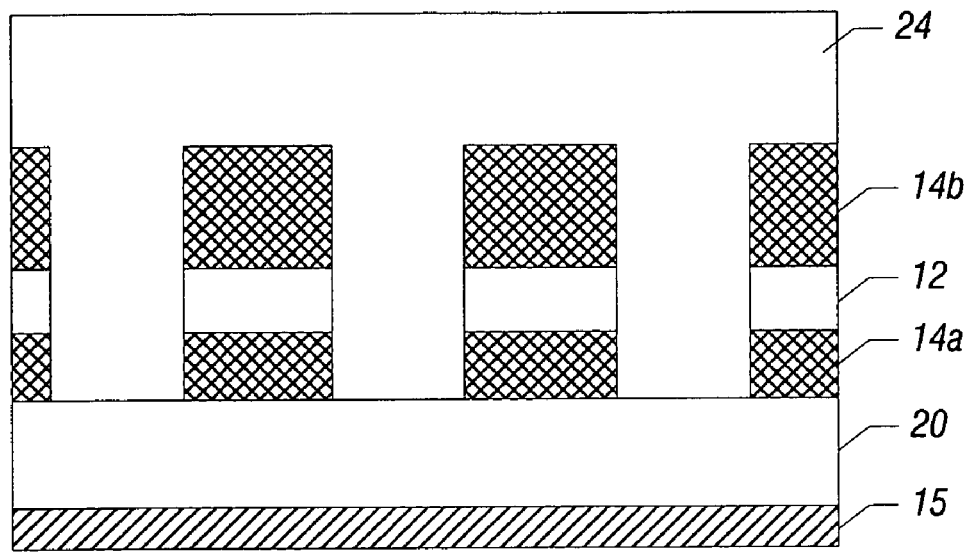
FIG. 4 is an enlarged, cross-sectional view at a subsequent stage of that shown in FIG. 3 in accordance with one embodiment.
Figure 5:
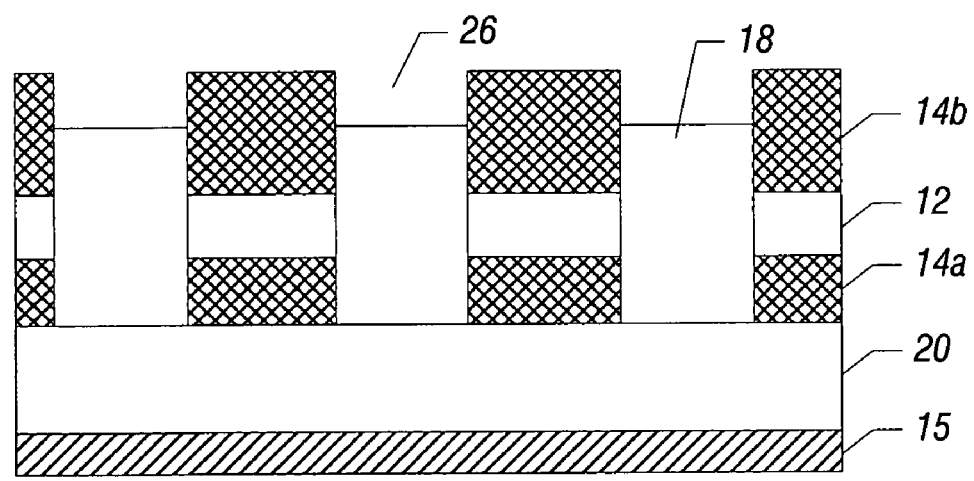
FIG. 5 is an enlarged, cross-sectional view at a subsequent stage of that shown in FIG. 4 in accordance with one embodiment.

Then, referring to FIG. 4, the phase change material 18, such as GST, may be deposited. The deposited phase change material 18 may be polished back, as shown in FIG. 5, and then recessed to form recess 26. This recessing may be achieved by a dip back or an overpolish, to mention two examples.

Figure 6:
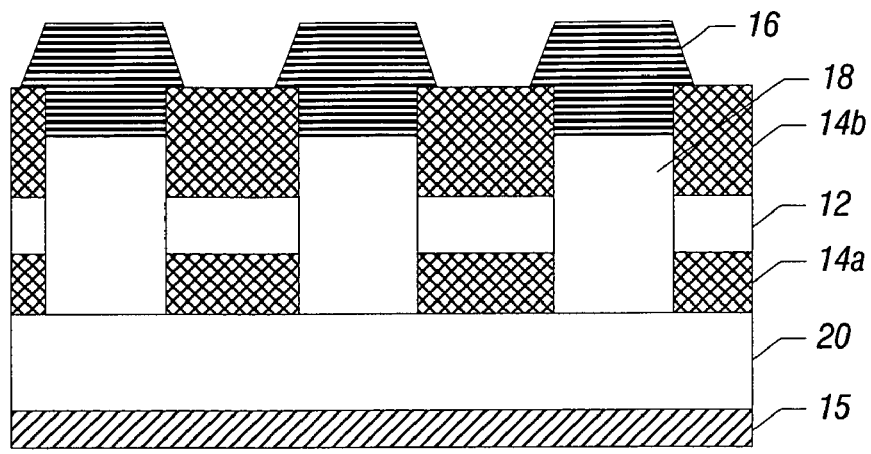
FIG. 6 is an enlarged, cross-sectional view at a subsequent stage of that shown in FIG. 5 in accordance with one embodiment.

The top electrode contact 16 is then deposited, as shown in FIG. 6. The contact 16 may be self-aligned to the phase change material 18 by filling the recess 26 (FIG. 5). The top electrode stack may take a variety of forms and is patterned to form an array.

Figure 7:
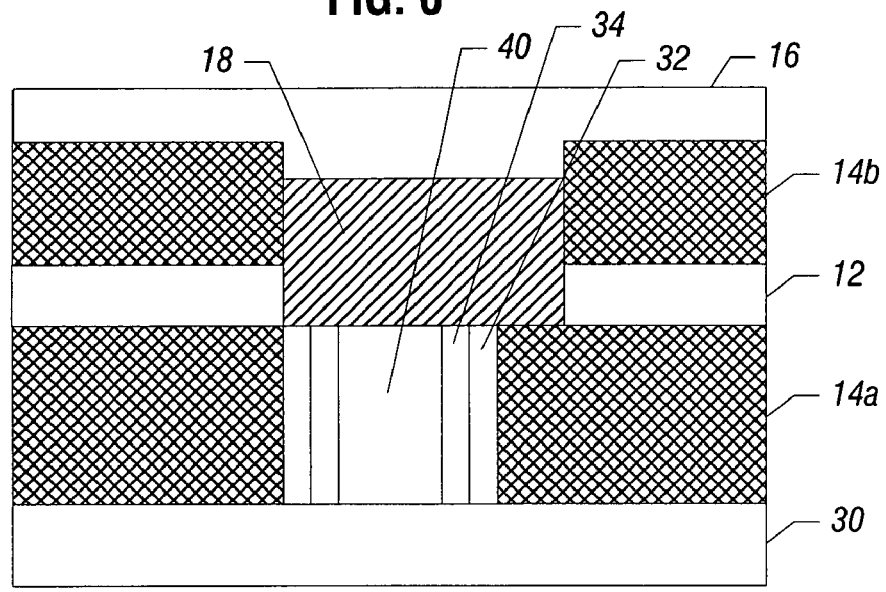
FIG. 7 is a partial, enlarged, cross-sectional view of another embodiment of the present invention.

In accordance with another embodiment of the present invention, shown in FIG. 7, a bottom electrode or conductive layer 30 may be coupled to a vertically oriented heater 40. The heater 40 contacts the phase change material 18, also contacted on its other end by a top electrode 16 or column. The heater 40 may be titanium silicon nitride in one embodiment.

A pore may be defined that includes the insulator layer 14a, the insulator layer 12, and the insulator layer 14b in some embodiments.

The heater 40 may be surrounded by a pair of sidewall spacers 34 and 32. The sidewall spacer 34 may be the same material as the layer 14a, in one embodiment, and the sidewall spacer 32 may be formed of another material, such as silicon nitride.

The insulator layer 12 may conform the molten phase change material region to its boundary with the phase change material 18 and, hence, may protect against creation of the leakage paths or reduced threshold voltage in the reset state. The insulator layer 12 may have a thermal conductivity much smaller than the insulator layers 14a or 14b.

To fabricate the embodiment of FIG. 7, an array select device (not shown) may be fabricated, and an insulator stack may be formed over the select device. The stack may be patterned by single or double lithography steps and etched to form an array of cylindrical or rectangular holes.

A bottom electrode material 30 may be deposited and polished off to contact a select device electrode (not shown). Next, the insulator stack may be formed in which the insulator layers 12, 14a, and 14b have well controlled thicknesses. The stack may be patterned by single or double lithography steps and etched to form an array of cylindrical or rectangular holes.

Phase change material 18 may be deposited to fill the holes and then polished back. The top electrode contact 16 may be deposited next and may be self-aligned to the phase change material 18 by filling the etched back phase change material. Bit line metal layers (not shown) may then be patterned using subtractive or damascene processes to form an array.

Programming of the phase change material 18 to alter the state or phase of the material may be accomplished by applying voltage potentials to the lower electrode 20 and upper electrode 16, thereby generating a voltage potential across the select device and memory element. When the voltage potential is greater than the threshold voltages of select device and memory element, then an electrical current may flow through the phase change material 18 in response to the applied voltage potentials, and may result in heating of the phase change material 18.

This heating may alter the memory state or phase of the material 18. Altering the phase or state of the phase change material 18 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

One or more MOS or bipolar transistors or one or more diodes (either MOS or bipolar) may be used as the select device. Also, an ovonic threshold switch may be used as a select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

Figure 8:
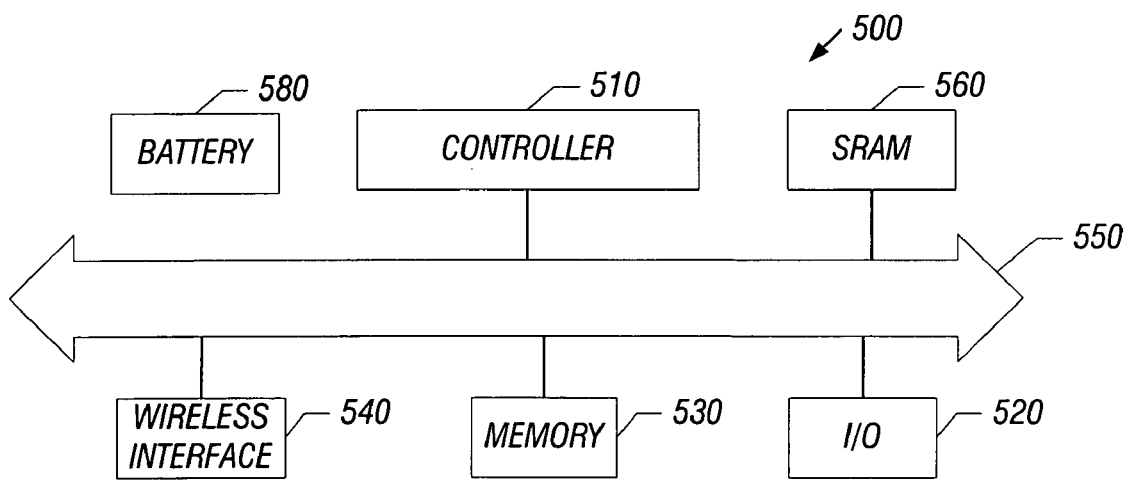
FIG. 8 is a system depiction for one embodiment.

Turning to FIG. 8, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first insulator layer;
   a second insulator layer over said first insulator layer, said second insulator layer being more thermally conductive than said first insulator layer;
   a third insulator layer under said first insulator layer, said third insulator layer being more thermally conductive than said first insulator layer;
   a pore in said third insulating layer that extends into said first and second insulating layers, said pore including a heater; and
   a phase change material within and surrounded by both of said first and second insulator layers
   wherein the first insulator layer is between the second insulator layer and the third insulator layer.

2. The apparatus of claim 1 wherein the thermal conductivity of said second insulator layer is at least twice the thermal conductivity of the first insulator layer.

3. The apparatus of claim 1, said third insulator layer having at least twice the thermal conductivity of said first insulator layer.

4. The apparatus of claim 3 wherein said second and third insulator layers are the same material.

5. The apparatus of claim 1 wherein said heater is adjacent said third insulator layer.

6. The apparatus of claim 1 wherein said first insulator layer is centered on said phase change material.

7. The apparatus of claim 1 wherein said first insulator layer is adjacent the bottom of said phase change material.

8. The apparatus of claim 7 including a heater under said phase change material.

9. The apparatus of claim 1 wherein said first insulator layer has a thermal conductivity of less than 5% of the thermal conductivity of said phase change material.

10. The apparatus of claim 1 wherein said second insulator layer has a thermal conductivity of more than five times the thermal conductivity of the phase change material.

* * * * *